(12) United States Patent
Kokal

(10) Patent No.: US 11,255,749 B2
(45) Date of Patent: Feb. 22, 2022

(54) METHOD AND DEVICE FOR CONTROLLING A TEST STAND ARRANGEMENT

(71) Applicant: AVL LIST GMBH, Graz (AT)

(72) Inventor: Helmut Kokal, Graz (AT)

(73) Assignee: AVL List GmbH, Graz (AT)

( * ) Notice: Subject to any disclaimer, the term of this patent is extended or adjusted under 35 U.S.C. 154(b) by 274 days.

(21) Appl. No.: 16/464,107

(22) PCT Filed: Nov. 24, 2017

(86) PCT No.: PCT/EP2017/080315
§ 371 (c)(1),
(2) Date: May 24, 2019

(87) PCT Pub. No.: WO2018/096085
PCT Pub. Date: Mar. 31, 2018

(65) Prior Publication Data
US 2019/0383703 A1    Dec. 19, 2019

(30) Foreign Application Priority Data

Nov. 28, 2016  (AT) .............................. A 51076/2016

(51) Int. Cl.
*G01M 13/026*    (2019.01)
*G01L 3/22*    (2006.01)
(Continued)

(52) U.S. Cl.
CPC ............. *G01M 13/026* (2013.01); *G01L 3/22* (2013.01); *G06F 5/06* (2013.01); *H03H 21/003* (2013.01); *B60W 2710/083* (2013.01)

(58) Field of Classification Search
CPC .... G01M 13/026; G01M 15/12; G01M 15/00; G01L 3/22; G01L 3/02; G06F 5/06;
(Continued)

(56) References Cited

U.S. PATENT DOCUMENTS 6,994,074 B2 *   2/2006   Doelker ................ F02D 31/008
                                                                    123/319
9,134,712 B2 *   9/2015   Kokal .................. G05B 13/048
(Continued)

FOREIGN PATENT DOCUMENTS

EP   0280948 A1    9/1988
JP   2006300684 A   11/2006
WO   2011022746 A1   3/2011

OTHER PUBLICATIONS

Kokal H et al: "Bandwidth extension of dynamical test benches by modified mechanical design under adaptive feedforward disturbance rejection", American Control Conference (ACC), 2010, IEEE, Piscataway, NJ, USA, Jun. 30, 2010 (Jun. 30, 2010), pp. 6151-6156, XP031719998, ISBN: 978-1-4244-7426-4.
(Continued)

*Primary Examiner* — Freddie Kirkland, III
(74) *Attorney, Agent, or Firm* — Dykema Gossett PLLC

(57) ABSTRACT

The invention relates to a device and to a method for controlling a test stand arrangement having a specimen and having a loading machine, which is connected to the specimen by a connecting shaft. An estimated value ($T_{E,est}$) for for the internal torque ($T_E$) of the specimen is determined and, from the estimated value ($T_{E,est}$), while taking into account a natural frequency ($f_0$) and a delay, a damping signal ($T_{Damp}$) is determined and fed back into the control loop.

14 Claims, 2 Drawing Sheets

(51) Int. Cl.
*G06F 5/06* (2006.01)
*H03H 21/00* (2006.01)

(58) Field of Classification Search
CPC .......... H03H 21/003; B60W 2710/083; B60W 2030/206; B60W 2050/0008; F16F 15/002
See application file for complete search history.

(56) References Cited

U.S. PATENT DOCUMENTS

| | | | |
|---|---|---|---|
| 9,207,149 B2* | 12/2015 | Kanke | G01M 13/025 |
| 9,517,761 B2* | 12/2016 | Kokal | B60W 10/08 |
| 9,632,007 B2* | 4/2017 | Bauer | G01M 13/025 |
| 9,950,639 B2* | 4/2018 | Vovos | B60L 15/20 |
| 10,309,869 B2* | 6/2019 | Sugita | G01M 15/05 |
| 10,444,117 B2* | 10/2019 | Akiyama | G05B 13/04 |
| 2006/0288764 A1* | 12/2006 | Langthaler | G01M 13/025 73/114.15 |
| 2011/0238359 A1 | 9/2011 | Kokal et al. | |
| 2015/0107347 A1* | 4/2015 | Bauer | G01M 13/025 73/115.05 |

OTHER PUBLICATIONS

Jakubek Stefan, Fleck Andreas: Model Reduction for Parametric Systems Using Balanced Truncation and Interpolation; Schätzung des inneren Drehmoments von Verbrennungsmotoren durch parameterbasierte Kalmanfilterung. Automatisierungstechnik 57 (8), S. 395-402, Aug. 1, 2009 (Aug. 1, 2009), DOI: 10.1524/auto.2009.0786.

* cited by examiner

METHOD AND DEVICE FOR CONTROLLING A TEST STAND ARRANGEMENT

CROSS-REFERENCE TO RELATED APPLICATIONS

This application is a national stage filing based upon International PCT Application No. PCT/EP2017/080315, filed 24 Nov. 2017, which claims the benefit of priority to Austria application No. A51076/2016, filed 28 Nov. 2016, the disclosures of which are incorporated herein by reference.

BACKGROUND

The invention relates to a method and a device for controlling a test stand arrangement comprising a test specimen and comprising a loading machine which is connected to the test specimen by a connecting shaft.

In engine test stands in a supercritical arrangement, the test stand natural frequency is often excited by not yet well-adjusted combustion processes in the individual cylinders of an internal combustion engine (especially in engines which are still in a development stage). This can then manifest by the 0.5th order occurring in the torque band, for example, which can then incite the test stand natural frequency. As a consequence, this resonance has an unnatural rotational speed curve of the internal combustion engine. Effects of this kind make clean calibration on the internal combustion engine difficult, or calibration can prove impossible, for example when detecting misfires.

This is problematic in that the disturbances caused in this way cannot be directly measured and are therefore removed from control.

The aim of the present invention is to provide methods and devices for controlling a test stand, by means of which effects of this kind can be greatly reduced.

WO2011/022746 discloses a method for controlling a test stand arrangement, wherein, in order to increase the control performance, the internal torque of the internal combustion engine is determined by means of evaluating the angle of rotation and is fed back into the control loop by means of a repetitive control method. Damping natural frequencies of the test stand arrangement is not included in the disclosure of WO2011/022746.

In real test stand environments it is often not possible to measure particular measurement variables, such as the angle of rotation, with sufficient accuracy. Either there are no sensors required for this purpose in the prior art, or the high expenditure that the installation and use of known sensors would entail makes using said sensors impossible. One aim of the present application is therefore to make it possible to damp natural vibrations by means of the sensor technology usually present in the test stand.

SUMMARY OF THE INVENTION

According to the invention, the aims of the present application are achieved by means of a method of the kind mentioned at the outset, in which an estimated value is determined for the internal torque of the test specimen, a damping signal being determined from the estimated value while taking into account a natural frequency to be damped and a delay, and said damping signal being fed back into the control loop. The damping signal that is fed back can optionally be set to an advantageous signal strength by means of a preferably settable amplification. Disturbances that come from the test specimen and cannot be measured per se can therefore be estimated and taken into account for damping. In this case, the actual disturbance variable (in the case of an internal combustion engine test stand, this is the internal combustion torque) is used in the form of an estimated value as an input into the control. In comparable devices, it was previously known to use a measured variable (e.g. a measuring flange torque, a test specimen rotational speed, a loading unit rotational speed, etc.) as the controller input. However, these measurement variables often already contain the effects of the natural frequency excited by the disturbance and are not very suitable as a controller input.

The estimated value can advantageously be determined from the test specimen angular velocity and the shaft torque. This makes it easier to determine the input values because the sensors that are usually present in the test stand can be used.

In one advantageous embodiment, when determining the damping signal from the estimated value, a band range comprising the natural frequency to be damped is filtered out and the filtered signal is delayed by a delay and amplified by an amplification. Due to the periodicity of the disturbance, an in-phase connection of the damping energy can therefore be fed back to the loading unit.

The parameters for the delay and/or the amplification and/or the band range are advantageously determined in advance in a simulation. This shortens the test stand time required for the test run and prevents time-consuming parameterization through trial and error.

In one preferred embodiment, the delay can be a constant parameter. This allows particularly simple implementation, for example using a FIFO memory parameterized using a constant delay. The disturbance variable is phase pre-rotated in this case by using periodicity of the disturbance variable and a constant natural frequency of the test stand arrangement. The delay can in this case be optimally adapted to the system performance of the control loop.

In order to advantageously implement the aforementioned method, the device mentioned at the outset has, according to the invention, a damping unit comprising an estimating unit and a filter, the estimating unit establishing an estimated value for the internal torque of the test specimen and the filter establishing a damping signal from the estimated value on the basis of a natural frequency to be damped and a delay, and feeding said damping signal back into the control loop.

The estimating unit can advantageously determine the estimated value from the test specimen angular velocity and the shaft torque. This allows an estimated value to be established without the need for additional sensor technology.

In one preferred embodiment, the estimating unit can comprise a Kalman filter, and this allows the estimated value to be generated easily and quickly.

In a further advantageous embodiment, the filter can comprise a delay element designed as a FIFO memory. This facilitates parameterization and allows a constant parameter to be used for the delay. Due to the periodicity of the disturbance, a compensation of the system delay of the controlled system can be fed back into the manipulated variable.

The test stand arrangement advantageously corresponds to a supercritical arrangement.

BRIEF DESCRIPTION OF THE DRAWINGS

The present invention is described in greater detail in the following with reference to FIGS. 1 to 4, which show exemplary, schematic and non-limiting advantageous embodiments of the invention. In the drawings.

DETAILED DESCRIPTION

Figure 1:
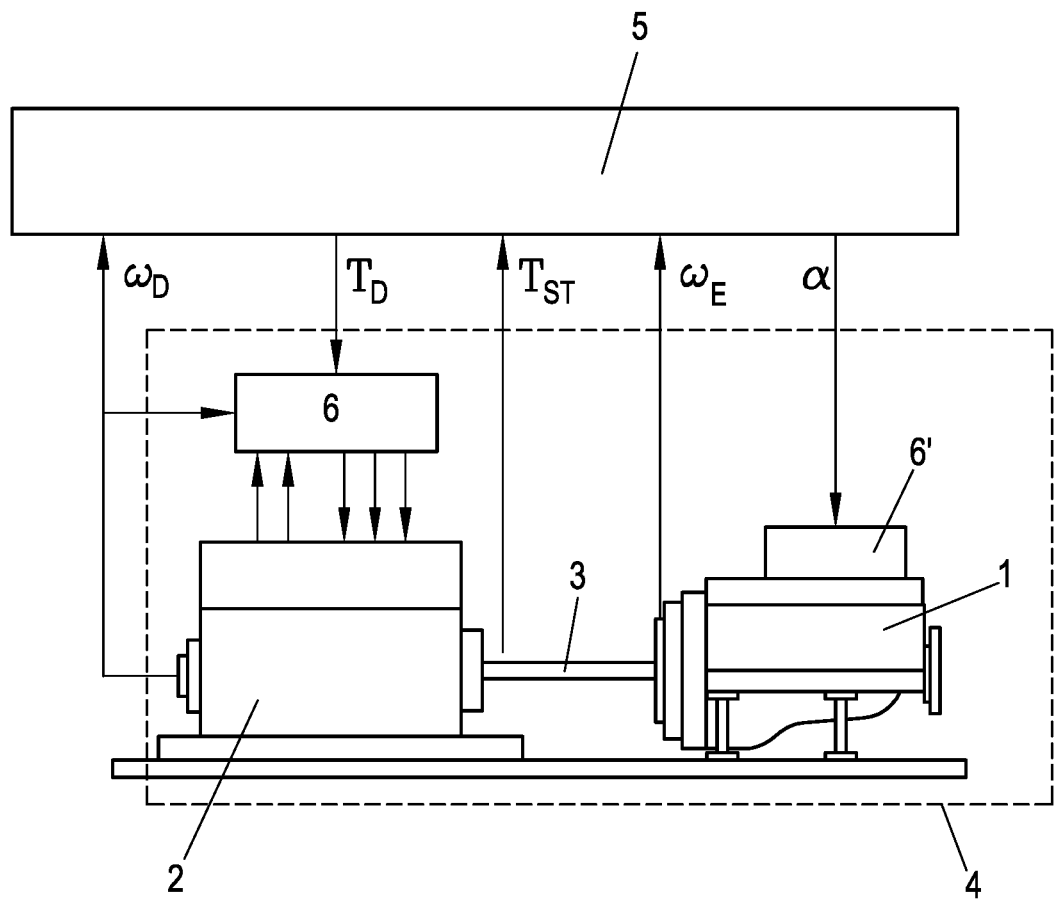
FIG. 1 is a schematic view of a test stand arrangement.

FIG. 1 is a schematic view of the essential components in a test stand. A test specimen 1, for example an internal combustion engine, is connected, by means of a connecting shaft 3, to a loading machine 2 which applies a load moment to the test specimen in accordance with a test run. In the context of the present description, the unit consisting of the test specimen 1, loading machine 2 and connecting shaft 3 is also referred to as a test stand arrangement 4.

An automation system 5 determines controlled variables and provides these to the test stand arrangement 4, for example a controlled variable for the loading machine torque $T_D$ of the loading machine 2 and a controlled variable for the pedal position $\alpha$ of the test specimen 1. The controlled variables are converted into the corresponding manipulated variables by a control mechanism 6 of the loading machine 2 or a control mechanism 6' of the test specimen 2.

The actual values of the controlled variables are determined by the automation system 5 via corresponding sensors, for example the actual values shown in FIG. 1 for the test specimen angular velocity $\omega_E$, the loading machine angular velocity $\omega_D$, and the shaft torque $T_{ST}$.

Figure 2:
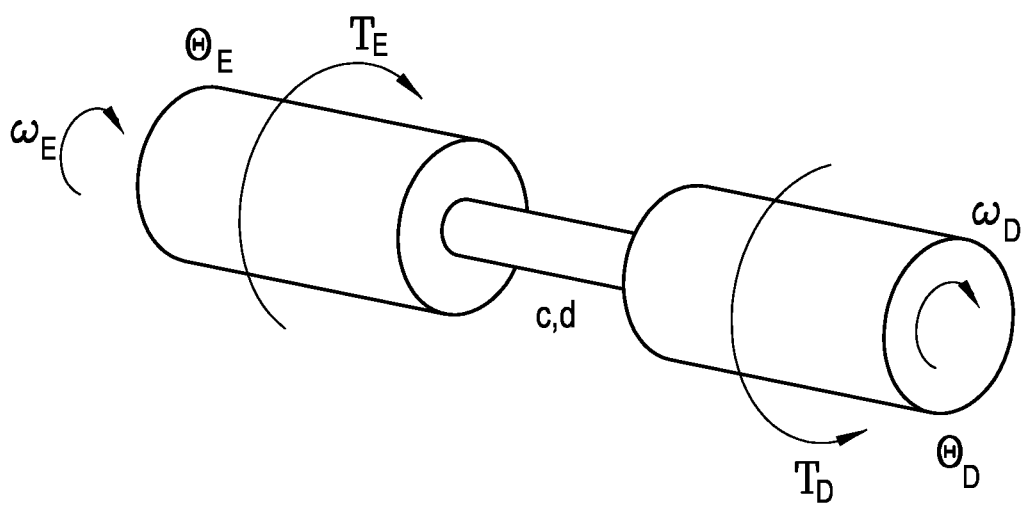
FIG. 2 is a schematic view of a mathematical model of a dual-mass oscillator.

The oscillation behavior of the test stand arrangement 4 can be mathematically modelled as a dual-mass oscillator, as shown in FIG. 2. In addition to the values defined above for the shaft torque $T_{ST}$, the loading machine torque $T_D$, the test specimen torque $T_E$, the loading machine angular velocity $\omega_D$ and the test specimen angular velocity $\omega_E$, the model also contains the shaft rigidity c, the shaft damping d, the test specimen moment of inertia $\theta_E$ and the loading machine moment of inertia $\theta_D$, by means of which natural frequencies of the system and the damping are mathematically determined.

For a test stand arrangement 4, a single natural frequency $f_0$ can usually be determined by means of modeling as a dual-mass oscillator. The dimensions of the connecting shaft 3 are usually selected such that this natural frequency is under the ignition frequency of the working range of a test specimen 1. The natural frequency is in this case in the range between the speed of the starter and the idle speed of the test specimen, and is therefore only briefly passed through by the test stand 4 upon starting the test specimen 1. An arrangement of this kind is referred to as a "supercritical arrangement."

A 4-cylinder engine having a working range of 600 to 6000 rpm can be taken as an example. At 600 rpm this results in an ignition frequency of 20 Hz. For a supercritical arrangement, the shaft connection is therefore dimensioned such that a natural frequency of 15 Hz, for example, is produced for the test stand arrangement.

However, in practical use, in particular in test runs using prototypes that are as of yet untested, disturbances can also be produced below the ignition frequency that can also excite the natural frequency. The natural frequency can, for example, be excited by a 0.5th order (of the rotational frequency) of a disturbance generated by the test specimen.

Figure 3:
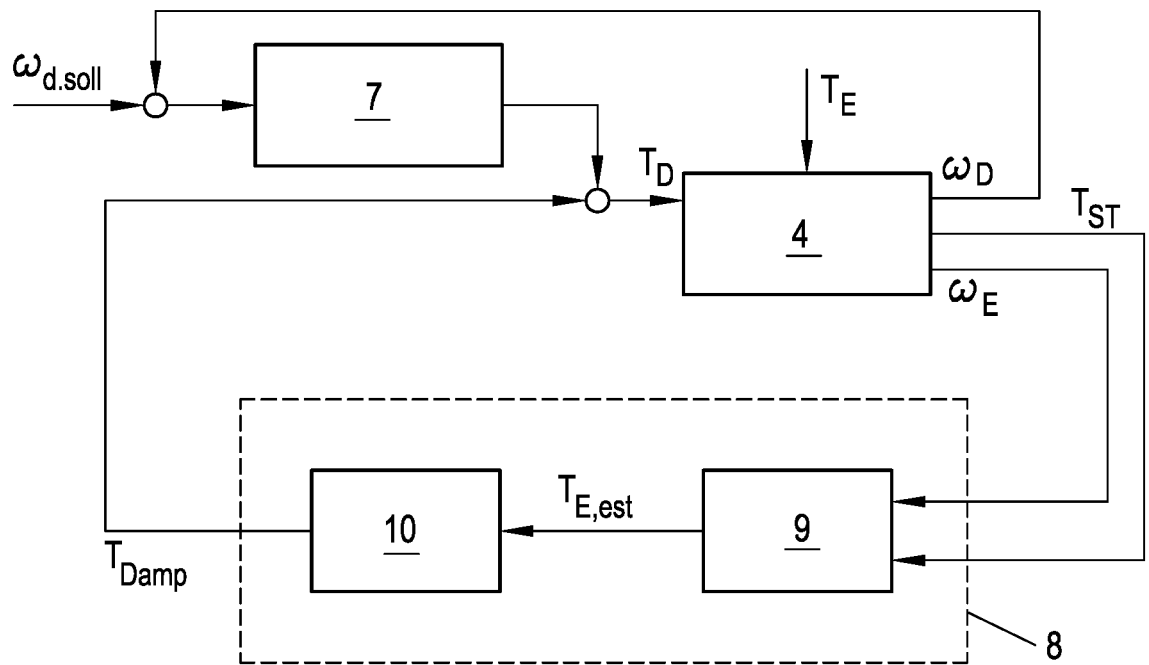
FIG. 3 is a block diagram of an exemplary controller structure according to the invention and FIG. 4 is a block diagram of active damping according to the invention.

According to the invention, in order to greatly reduce effects of this kind, this description discloses active damping, which is described in the following with reference to FIG. 3, with one part of the controller structure for the loading machine being shown schematically in FIG. 3.

As an input of a speed controller 7, a control deviation is formed as a difference between a target value of the loading machine angular velocity $\omega_{D,Target}$ and the actual value of the loading machine angular velocity $\omega_D$. The speed controller 7 establishes a controlled variable for the loading machine torque $T_D$ on the basis of the control deviation, which variable is transmitted to the test stand arrangement 4 (or to the control mechanism 6 thereof shown in FIG. 1). In this case the controlled variable is corrected by a damping signal $T_{Damp}$ that is determined by a damping unit 8 on the basis of the shaft torque $T_{ST}$ and the test specimen angular velocity $\omega_E$.

For this purpose, the damping unit 8 comprises an estimating unit 9 which determines an estimated value $T_{E,est}$ for an internal torque $T_E$ of the test specimen 1. The internal torque $T_E$ of the test specimen cannot be directly measured on the test stand and can therefore be considered a non-measurable disturbance variable of the control loop. However, this variable is an essential variable as the control input variable for active damping, since it contains the excitation for the dual-mass oscillator system.

In order to establish the estimated value $T_{E,est}$ for the internal torque $T_E$, the estimating unit 9 can comprise a Kalman filter which is optimized for the corresponding frequency range and determines the estimated value $T_{E,est}$ on the basis of the shaft torque $T_{ST}$ and the test specimen angular velocity $\omega_E$. The filter unit 10 then converts the estimated value $T_{E,est}$ obtained by the estimating unit 9 into the damping signal $T_{Damp}$.

Figure 4:
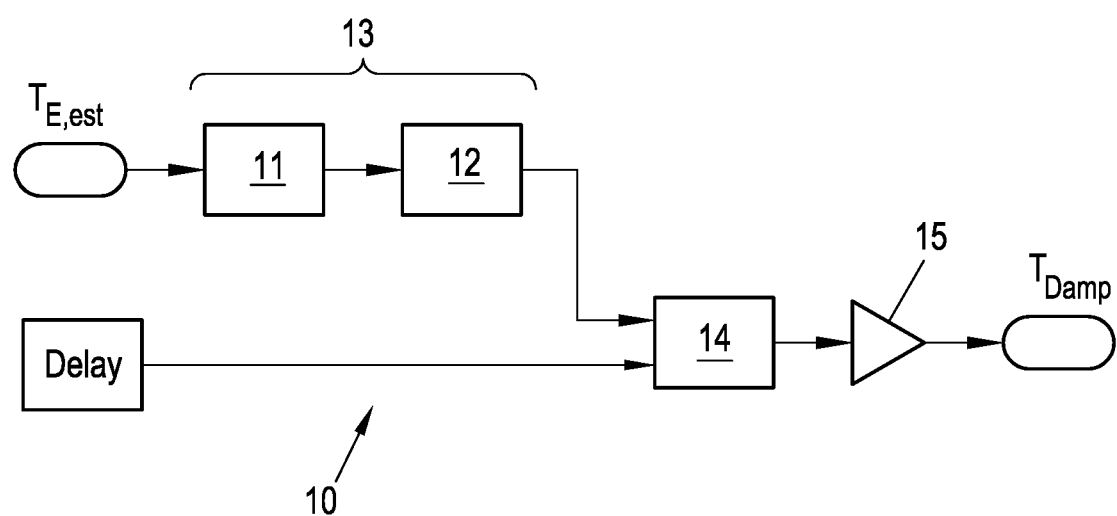

The filter unit 10 is shown schematically in greater detail in FIG. 4. In the filter unit 10, the signal of the estimated value $T_{E,est}$ is first freed from the DC component by means of a high-pass filter 11. The low-pass filter 12 arranged downstream is optional and is only required if the higher AC components in the manipulated variable for the loading machine 2 exceed the threshold values for the loading machine 2. The high-pass filter 11 and the low-pass filter 12 can therefore be considered a band-pass filter 13 which filters a band range comprising the natural frequency to be damped out of the signal of the estimated value $T_{E,est}$.

In order to compensate for the down times, a delay (Delay) is then applied to the signal in a delay element 14 and the signal is amplified in an amplifier 15 in order to obtain the damping signal $T_{Damp}$ in an optimum amplitude for damping.

In order to produce the delay (which can also be interpreted as a phase change) in a simple manner, the delay element can be designed as a FIFO memory having a constant (or parameterizable) length. A constant length is admissible because a specific and known frequency (the natural frequency) is intended to be damped. It is also assumed that this is a periodic disturbance, and this also matches test results and is confirmed in the technical literature.

Under these assumptions, the following phase errors can be compensated for using the FIFO memory:

systematic errors, since the damping torque is not introduced at the shaft but instead in the air gap of the loading unit (90° phase error)

phase errors which occur as a result of non-zero phase response of different filter networks in the control or as a result of down times in the closed-loop control loop.

The optimum degree of damping can be set by a parameterizable amplification in the amplifier 15.

Both the parameterizable value of the amplification and the delay or phase compensation can be determined in advance in a simulation of the test run, and therefore do not have to be determined by trial and error.

LIST OF REFERENCE SIGNS

Test specimen 1
Loading machine 2
Connecting shaft 3
Test stand arrangement 4
Automation system 5
Control mechanism 6, 6'
Speed controller 7
Damping unit 8
Estimating unit 9
Filter 10
High-pass filter 11
Low-pass filter 12
Band-pass filter 13
Delay element 14
Amplifier 15
Pedal position $\alpha$
Loading machine torque $T_D$
Shaft torque $T_{ST}$
Test specimen moment of inertia $\theta_E$
Loading machine angular velocity $\omega_D$
Test specimen angular velocity $\omega_E$
Shaft rigidity c
Shaft damping d
Loading machine moment of inertia $\theta_D$
Test specimen moment of inertia $\theta_E$

The invention claimed is:

1. A method for controlling a test stand arrangement including a test specimen and a loading machine which is connected to the test specimen by a connecting shaft the test stand arrangement corresponding to a supercritical arrangement, the method including the following steps:
determining an estimated value ($T_{E,est}$) for an internal torque ($T_E$) of the test specimen;
determining a damping signal ($T_{Damp}$) from the estimated value ($T_{E,est}$) while taking into account a natural frequency ($f_0$) of the test stand arrangement that is to be damped and a delay; and
feeding the damping signal back into a control loop for controlling the test stand arrangement.

2. The method according to claim 1, characterized in that the estimated value ($T_{E,est}$) is determined from the test specimen angular velocity ($\omega_E$) and the shaft torque ($T_{ST}$).

3. The method according to claim 1, characterized in that, when determining the damping signal ($T_{Damp}$) from the estimated value ($T_{E,est}$), a band range comprising the natural frequency ($f_0$) to be damped is filtered out and the filtered signal is delayed by the delay and amplified by an amplification (Gain).

4. The method according to claim 1, characterized in that the delay is a constant parameter.

5. A device for controlling a test stand arrangement, the device comprising:
a test specimen;
a loading machine which is connected to the test specimen by a connecting shaft;
the test stand arrangement (4) corresponding to a supercritical arrangement,
a damping unit including
an estimating unit configured and arranged to establish an estimated value ($T_{E,est}$) for the internal torque ($T_E$) of the test specimen, and
a filter configured and arranged to establish a damping signal ($T_{Damp}$) from the estimated value ($T_{E,est}$) on the basis of a natural frequency ($f_0$) of the test stand arrangement that is to be damped and a delay and feeding said damping signal back into a control loop of the test stand arrangement.

6. The device of claim 5, characterized in that the estimating unit is further configured and arranged to determine the estimated value ($T_{E,est}$) from a test specimen angular velocity ($\omega_E$) and a shaft torque ($T_{ST}$).

7. The device of claim 6, wherein the estimating unit is configured and arranged to utilize a Kalman filter.

8. The device of claim 6, wherein the filter includes a delay element configured and arranged to operate as a FIFO memory for the device.

9. The device of claim 5, characterized in that the estimating unit is configured and arranged to utilize a Kalman filter.

10. The device of claim 9, wherein the filter includes a delay element configured and arranged to operate as a FIFO memory for the device.

11. The device of claim 5, characterized in that the filter includes a delay element configured and arranged to operate as a FIFO memory, facilitates parameterization and allows a constant parameter to be used for the delay.

12. A method for controlling a test stand arrangement including a test specimen and a loading machine which is connected to the test specimen by a connecting shaft—the test stand arrangement corresponding to a supercritical arrangement, the method including the following steps:
determining an estimated value ($T_{E,est}$) for an internal torque ($T_E$) of the test specimen;
determining a damping signal ($T_{Damp}$) from the estimated value ($T_{E,est}$) while taking into account a natural frequency ($f_0$) of the test stand arrangement that is to be damped and a delay; and
feeding the damping signal back into a control loop for controlling the test stand arrangement;
characterized in that, when determining the damping signal ($T_{Damp}$) from the estimated value ($T_{E,est}$), a band range comprising the natural frequency ($f_0$) to be damped is filtered out and the filtered signal is delayed by the delay and amplified by an amplification (Gain);
characterized in that one or more of the following parameters are determined in advance of a simulation on the test stand arrangement: the delay, the amplification (Gain), and the band range.

13. The method of claim 12, characterized in that the delay (Delay) is a constant parameter.

14. A method for controlling a test stand arrangement including a test specimen and a loading machine which is connected to the test specimen by a connecting shaft—the test stand arrangement corresponding to a supercritical arrangement, the method including the following steps:
determining an estimated value ($T_{E,est}$) for an internal torque ($T_E$) of the test specimen;
determining a damping signal ($T_{Damp}$) from the estimated value ($T_{E,est}$) while taking into account a natural frequency ($f_0$) of the test stand arrangement that is to be damped and a delay; and feeding the damping signal back into a control loop for controlling the test stand arrangement;

characterized in that the estimated value ($T_{E,est}$) is determined from the test specimen angular velocity ($\omega_E$) and the shaft torque ($T_{ST}$);

characterized in that, when determining the damping signal ($T_{Damp}$) from the estimated value ($T_{E,est}$), a band range comprising the natural frequency ($f_0$) to be damped is filtered out and the filtered signal is delayed by the delay and amplified by an amplification (Gain).

* * * * *